(12) United States Patent
Baheti et al.

(10) Patent No.: US 11,600,902 B2
(45) Date of Patent: Mar. 7, 2023

(54) ANTENNA-IN-PACKAGE DEVICE WITH CHIP EMBEDDING TECHNOLOGIES

(71) Applicant: Infineon Technologies AG, Neubiberg (DE)

(72) Inventors: Ashutosh Baheti, Munich (DE); EungSan Cho, Torrance, CA (US); Saverio Trotta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 181 days.

(21) Appl. No.: 16/790,460

(22) Filed: Feb. 13, 2020

(65) Prior Publication Data

US 2021/0257716 A1    Aug. 19, 2021

(51) Int. Cl.

| | |
|---|---|
| H01Q 1/22 | (2006.01) |
| H01L 23/31 | (2006.01) |
| H01L 23/498 | (2006.01) |
| H01L 23/66 | (2006.01) |
| H01L 23/00 | (2006.01) |
| H01L 21/48 | (2006.01) |
| H01L 21/56 | (2006.01) |

(52) U.S. Cl.
CPC ....... *H01Q 1/2283* (2013.01); *H01L 21/4857* (2013.01); *H01L 21/565* (2013.01); *H01L 23/3128* (2013.01); *H01L 23/49816* (2013.01); *H01L 23/49822* (2013.01); *H01L 23/49838* (2013.01); *H01L 23/66* (2013.01); *H01L 24/05* (2013.01); *H01L 24/19* (2013.01); *H01L 24/20* (2013.01); *H01L 2223/6616* (2013.01); *H01L 2223/6677* (2013.01); *H01L 2924/1421* (2013.01)

(58) Field of Classification Search
None
See application file for complete search history.

(56) References Cited

U.S. PATENT DOCUMENTS

| | | | |
|---|---|---|---|
| 6,320,543 | B1 | 11/2001 | Ohata et al. |
| 2009/0322643 | A1 | 12/2009 | Choudhury |
| 2010/0151344 | A1* | 6/2010 | Otomaru ........... H01M 8/04201 |
| | | | 429/444 |
| 2013/0141284 | A1 | 6/2013 | Jeong |

(Continued)

FOREIGN PATENT DOCUMENTS

WO    2012081288 A1    6/2012

*Primary Examiner* — Jay C Chang
(74) *Attorney, Agent, or Firm* — Slater Matsil, LLP

(57) ABSTRACT

A semiconductor device includes: a dielectric substrate; an integrated circuit (IC) die disposed inside an opening of the dielectric substrate, where the IC die is configured to transmit or receive radio frequency (RF) signals; a dielectric material in the opening of the dielectric substrate and around the IC die; a redistribution structure along a first side of the dielectric substrate, where a first conductive feature of the redistribution structure is electrically coupled to the IC die; a second conductive feature along a second side of the dielectric substrate opposing the first side; a via extending through the dielectric substrate, where the via electrically couples the first conductive feature and the second conductive feature; and an antenna at the second side of the dielectric substrate, where the second conductive feature is electrically or electromagnetically coupled to the antenna.

20 Claims, 15 Drawing Sheets

(56) References Cited

U.S. PATENT DOCUMENTS

| | | |
|---|---|---|
| 2018/0286822 A1 | 10/2018 | Kim et al. |
| 2018/0337148 A1* | 11/2018 | Baek .................. H01L 25/0657 |
| 2019/0058241 A1* | 2/2019 | So ..................... H01L 23/49822 |
| 2019/0181085 A1* | 6/2019 | Chen ....................... H01L 24/17 |
| 2021/0036413 A1* | 2/2021 | Kim .................... H01L 23/5385 |

* cited by examiner

ANTENNA-IN-PACKAGE DEVICE WITH CHIP EMBEDDING TECHNOLOGIES

TECHNICAL FIELD

The present invention relates generally to semiconductor devices, and, in particular embodiments, to antenna-in-package (AiP) devices.

BACKGROUND

Semiconductor devices with embedded radio-frequency integrated circuits (RFICs) are used in electrical equipment such as mobile devices. An example of such a semiconductor device is an antenna-in-package (AiP) device.

Antenna-in-package (AiP) represents a new trend in integrated circuit (IC) packaging which is an enabler of smaller and highly integrated semiconductor devices. An AiP device includes an RFIC (e.g., an IC including a baseband module and an RF module) and an antenna inside a same package. Antenna-in-package allows integration of complex RF components together with base-band circuitry into a self-contained module. AiP devices not only reduce the footprint of the functional modules they integrated, but they also facilitate the work of system integrators. For example, the system integrators no longer have to design complex RF circuits at the application printed circuit board (PCB) level. Moreover, the overall size of the complete application is reduced.

While it may be advantageous to continuously reduce the sizes of the AiP devices due to the shrinking size of the electrical equipment (e.g., mobile phones), challenges exist. For example, at millimeter wave frequencies, the limiting factors for reducing the size of the AiP devices may not come from antenna size but from the dispensing and routing of ball pads (e.g., conductive pads on which external connectors such as solder balls are formed) and the size of the ball pads. New structures and integration methods are needed in the art to further reduce the size of the AiP devices.

SUMMARY

In accordance with an embodiment of the present invention, a semiconductor device includes: a dielectric core; a radio-frequency integrated circuit (RFIC) disposed in an opening of the dielectric core and surrounded by a dielectric material, where the dielectric material fills a space between the RFIC and the dielectric core; a redistribution structure at a first side of the dielectric material, where a first conductive feature of the redistribution structure is electrically coupled to the RFIC; an antenna at a second side of the dielectric material opposing the first side; and a via laterally spaced apart from the RFIC and extending through the dielectric core, where a first end of the via is electrically coupled to the first conductive feature of the redistribution structure, and a second end of the via is electrically coupled to the antenna or is electrically coupled to a second conductive feature extending along the second side of the dielectric material, and where the second conductive feature is configured to be electromagnetically coupled to the antenna.

In accordance with an embodiment of the present invention, a semiconductor device includes: a dielectric substrate; an integrated circuit (IC) die disposed inside an opening of the dielectric substrate, where the IC die is configured to transmit or receive radio frequency (RF) signals; a dielectric material in the opening of the dielectric substrate and around the IC die; a redistribution structure along a first side of the dielectric substrate, where a first conductive feature of the redistribution structure is electrically coupled to the IC die; a second conductive feature along a second side of the dielectric substrate opposing the first side; a via extending through the dielectric substrate, where the via electrically couples the first conductive feature and the second conductive feature; and an antenna at the second side of the dielectric substrate, where the second conductive feature is electrically or electromagnetically coupled to the antenna.

In accordance with an embodiment of the present invention, a method includes: placing a radio-frequency integrated circuit (RFIC) in an opening of a dielectric core; filling the opening of the dielectric core with a dielectric material; forming a via that extends through the dielectric core; forming a redistribution structure at a first side of the dielectric core, where a first conductive feature of the redistribution structure is formed to be electrically coupled to the RFIC; forming a second conductive feature at a second side of the dielectric core opposing the first side, where the second conductive feature is electrically coupled to the first conductive feature by the via; and forming an antenna at the second side of the dielectric core, where the antenna is formed to be electrically or electromagnetically coupled to the second conductive feature.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
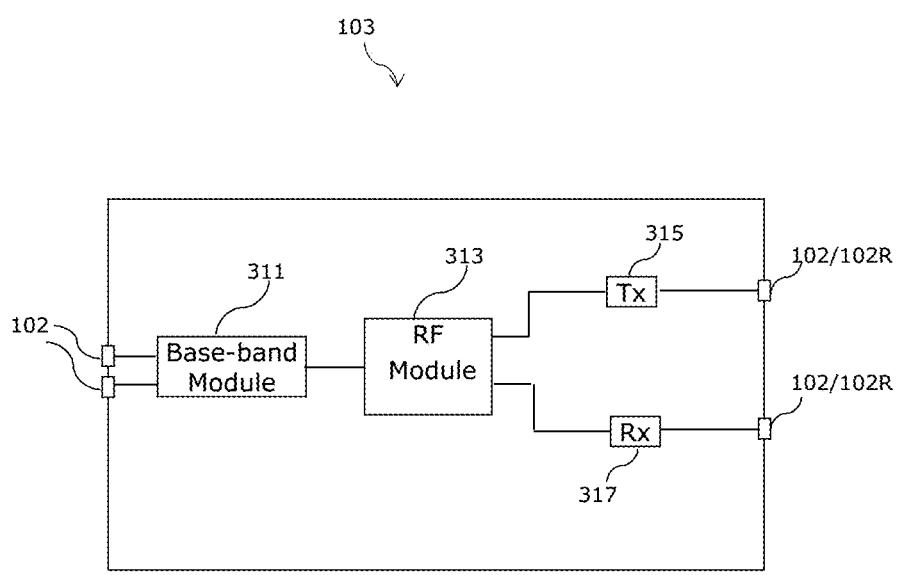
FIG. 1 is a block diagram of a radio-frequency integrated circuit (RFIC), in some embodiments.

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Throughout the discussion, unless otherwise specified, the same or similar reference numerals in different embodiments refer to the same or similar component formed by a same or similar material(s) using a same or similar formation method.

The present invention will be described with respect to example embodiments in a specific context, namely antenna-in-package (AiP) devices. In an embodiment, an AiP device includes a radio-frequency integrated circuit (RFIC) disposed in an opening of a dielectric core and surrounded by a dielectric material, where the dielectric material fills a space between the RFIC and the dielectric core. The AiP device also includes a redistribution structure at a first side of the dielectric material, where a first conductive feature of the redistribution structure is electrically coupled to the RFIC. The AiP device further includes an antenna at a second side of the dielectric material opposing the first side, and a via laterally spaced apart from the RFIC and extending through the dielectric core, wherein a first end of the via is electrically coupled to the first conductive feature of the redistribution structure, and a second end of the via is electrically coupled to the antenna or is electrically coupled to a second conductive feature extending along the second side of the dielectric material, where the second conductive feature is configured to be electromagnetically coupled to the antenna.

FIG. 1 is a block diagram of a radio-frequency integrated circuit (RFIC) 103, in an embodiment. The RFIC 103 may be used to form the various embodiments of antenna-in-package (AiP) devices disclosed herein.

FIG. 1 illustrates a functional block diagram of the RFIC 103, which may also be referred to as an RFIC die or an RFIC chip. Note that for simplicity, not all functional blocks of the RFIC 103 are illustrated in FIG. 1. In the example of FIG. 1, the RFIC 103 includes a base-band module 311, an RF module 313, a transmit (Tx) module 315, and a receive (Rx) module 317. The base-band module 311 is designed to perform digital base-band processing functions, such as digital filtering, equalization, digital re-sampling, or the like. The RF module 313 is designed to handle RF signals and perform RF related functions, such as modulating or demodulating RF signals. The RF module 313 may include RF related components such as mixers, oscillators, or the like. Depending on the design of the RFIC 103, analog-to-digital converters (ADCs) and/or digital-to-analog converters (DACs) may be formed in the RF module 313 or in the base-band module 311. The Tx module 315 is designed to perform functions related with transmitting RF signals, and may include electrical components such as power amplifiers. The Rx module 317 is designed to perform functions related with receiving RF signals, and may include electrical components such as analog filters, lower-noise amplifiers, or the like. The RFIC 103 is electrically coupled to external circuits through conductive pads 102 (may also be referred to as input/output (I/O) pads). FIG. 1 further illustrates RF terminals 102R (e.g., I/O pads connected to the Tx or Rx modules) which are electrically coupled to the Tx module 315 and/or to the Rx module 317. In some embodiments, the RFIC 103 only transmits RF signals, and therefore, includes the Tx module 315 but does not include the Rx module 317. In other embodiments, the RFIC 103 only receive RF signals, and therefore, includes the Rx module 317 but does not include the Tx module 315. These and other variations are fully intended to be included within the scope of the present disclosure.

Figure 2:
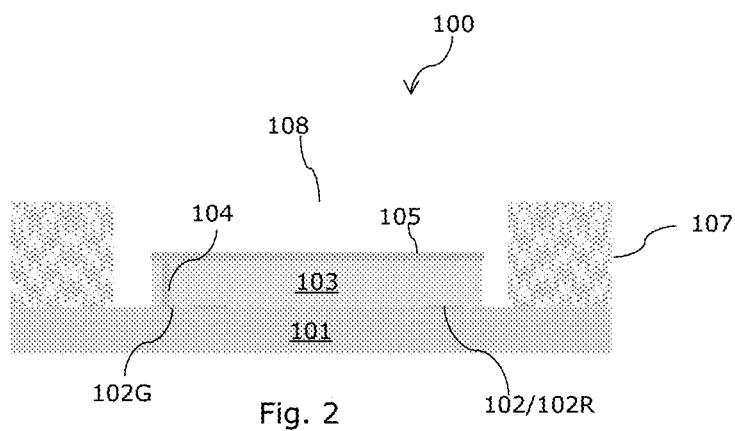
FIGS. 2-6, 7A and 7B illustrate various views of a semiconductor device at various stages of fabrication, in an embodiment.

FIGS. 2-6, 7A and 7B illustrate various views (e.g., cross-sectional view, plan view) of a semiconductor device 100 (e.g., an AiP device) at various stages of fabrication, in an embodiment. Referring to FIG. 2, a core 107 (may also be referred to as a dielectric core, a dielectric core substrate, or a dielectric substrate) with an opening 108 is attached to a carrier 101, and an RFIC 103 is placed inside the opening 108 and attached to the carrier 101. In other words, the opening 108 forms a cavity in the core 107 within which the RFIC 103 is arranged. The core 107 thus surrounds the RFIC 103 laterally. For instance, the cavity is arranged in the center region of the core 107, The carrier 101 may be made of a material such as metal foil, ceramic, glass, glass epoxy, silicon, polymer, polymer composite, beryllium oxide, tape, or other suitable material for structural support. In some embodiments, an adhesive layer, such as a die attaching film (DAF), may be used to attach the core 107 and/or the RFIC 103 to the carrier 101.

The core 107 is formed of a dielectric material such as epoxy resin or fiber glass (such as pre-preg). For example, the core 107 may include bismaleimide triazine (BT) resin, FR-4 (a composite material composed of woven fiberglass cloth with an epoxy resin binder that is flame resistant), ceramic, glass, plastic, tape, film, or other supporting materials. The opening 108 is formed in the core 107 by, e.g., a drilling process such as a mechanical drilling process or a laser drilling process. The opening 108 is large enough to accommodate the RFIC 103.

In the example of FIG. 2, the front side (e.g., the side with I/O pads 102) of the RFIC 103 is attached to the carrier 101. The backside of the RFIC 103 has a ground plane 105, which may be a layer of electrically conductive material (e.g., copper) formed over the backside of the RFIC 103. The ground plane 105 may be electrically grounded, e.g., by a through-substrate-via (TSV) 104 that electrically couples the ground plane 105 to a ground I/O pad 102G (e.g., an I/O pad that is configured to be electrically grounded). For simplicity, the TSV 104 and the ground I/O pad 102G may not be illustrated in subsequent figures, with the understanding that the TSV 104 and the ground I/O pad 102G may be formed. The ground plane 105 is optional, and therefore, may be omitted in some embodiments. The ground plane 105 may reduce the electromagnetic interference (EMI) to or from the RFIC 103, as skilled artisans readily appreciate.

Figure 3:
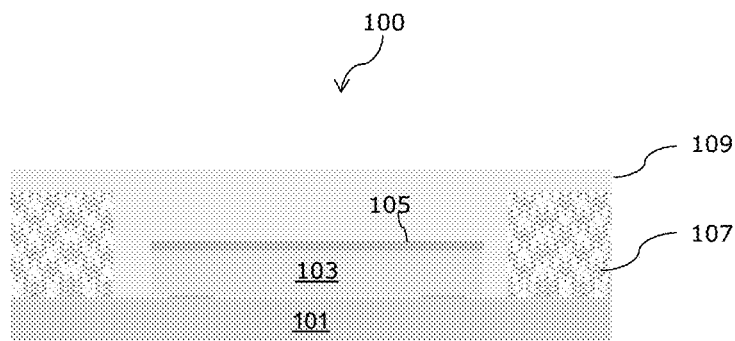

Next, in FIG. 3, a dielectric material 109 (also referred to as an encapsulant) is formed over the carrier 101 to surround the RFIC 103 and fills the opening 108. The dielectric material 109 may also cover the upper surface of the core 107. The dielectric material 109 may be formed of a suitable encapsulating material such as resin, epoxy, an organic polymer, a polymer with or without a silica-based or glass filler added, or other materials, as examples. For example, a resin sheet, such as an Ajinomoto Build-up Film (ABF), may be deposited over the structure shown in FIG. 2 and cured to from the dielectric material 109. Therefore, the dielectric material 109 forms a molding material, in the illustrated embodiments.

Figure 4:
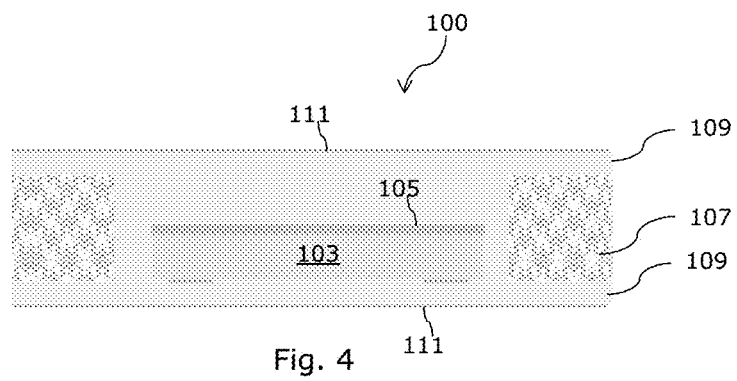

Next, in FIG. 4, the carrier 101 is removed, e.g., by a carrier de-bonding process. Furthermore, additional dielectric material 109 is formed over the lower surface of the core 107 and over the front side of the RFIC 103, e.g., using a same or similar formation process discussed above. Next, seed layers 11 are formed on the upper surface and the lower surface of the dielectric material 109. The seed layers 11 may comprise a suitable conductive material such as copper, and may be formed by laminating a thin metal foil (e.g., copper foil) over the upper and lower surfaces of the dielectric material 109. In some embodiments, the seed layers 111 are formed using a suitable formation method such as chemical vapor deposition (CVD), physical vapor deposition (PVD), or the like.

Figure 5:
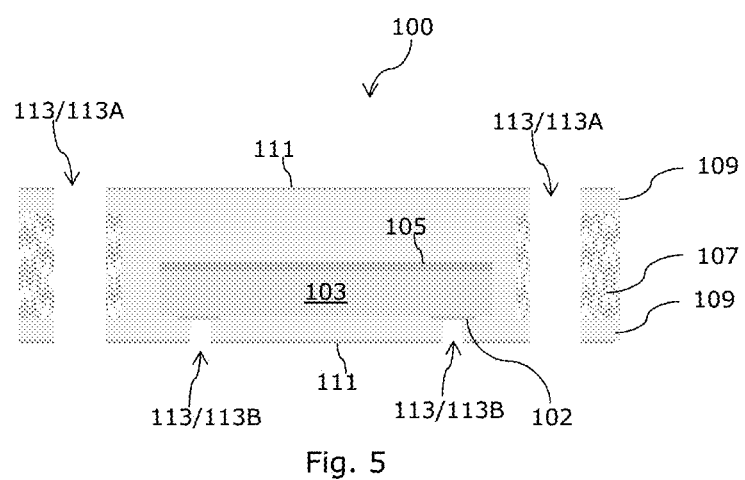

Next, in FIG. 5, openings 113 (e.g., 113A and 113B) are formed in the core 107 or in the dielectric material 109. In the example of FIG. 5, openings 113A (e.g., through holes) extends through the core 107/dielectric material 109 and may be formed by a mechanical drilling process. The openings 113B (e.g., recesses) extends partially through the dielectric material 109 to expose the conductive pads 102 of the RFIC 103. In some embodiments, the bottommost surface of the conductive pads 102 may be or include a layer of copper, and the openings 113B are formed by a laser drilling process. The layer of copper of the conductive pads 102 may act as a stop layer to control the stop point for the laser drilling process.

Figure 6:
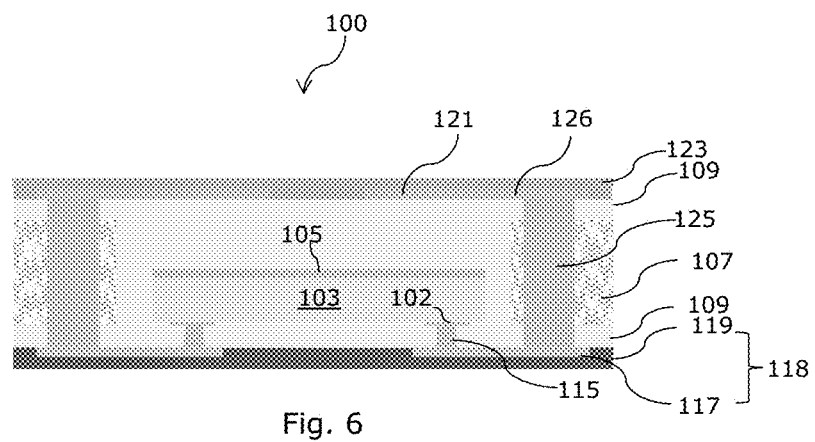

Next, in FIG. 6, an electrically conductive material (e.g., copper) is formed in the openings 113 (see FIG. 5) and on the upper surface and the lower surface of the dielectric material 109 using a suitable formation method, such as plating. The electrically conductive material in the openings 113A forms vias 125, and the electrically conductive material in the openings 113B forms micro-vias 115.

In addition, conductive features 117 such as metal lines are formed along the lower surface of the dielectric material 109. The metal lines re-route signals from the conductive pads 102 of the RFIC 103 to different locations for connection with, e.g., vias 125 or external connectors 127 (see FIG. 7A). For example, the conductive features 117 (e.g., metal line) may be electrically coupled to the conductive pads 102 of the RFIC 103 through the micro-vias 115, and may electrically couple the RFIC 103 to conductive features (e.g., 126) formed at the upper surface of the dielectric material 109. The conductive features 117 may be formed by forming a patterned photo resist layer with a designed pattern over the seed layer 11, plating the conductive material over exposed portions of the seed layer 11 (e.g., exposed by the patterns of the patterned photo resist layer), removing the patterned photo resist layer after the plating, and etching away portions of the seed layer 11 over which the conductive material is not formed.

After the conductive features 117 are formed, a dielectric layer 119 is formed over the lower surface of the dielectric material 109 to cover the conductive features 117. In some embodiments, the dielectric layer 119 is formed of a polymer, such as polybenzoxazole (PBO), polyimide, benzocyclobutene (BCB), or the like. In other embodiments, the dielectric layer 119 is formed of a nitride such as silicon nitride; an oxide such as silicon oxide, phosphosilicate glass (PSG), borosilicate glass (BSG), or boron-doped phosphosilicate glass (BPSG); or the like. The dielectric layers 119 may be formed by any acceptable deposition process, such as spin coating, chemical vapor deposition (CVD), laminating, the like, or a combination thereof. The conductive features 117 and the dielectric layer 119 may be collectively referred to as a redistribution structure 118. Although FIG. 6 shows one layer of conductive feature 117 and one dielectric layer 119 in the redistribution structure 118, the redistribution structure 118 may include multiple layers of conductive features (e.g., conductive lines and vias) formed in multiple dielectric layers.

Still referring to FIG. 6, conductive features 126 (e.g., metal lines) and antennas 121 are formed over the upper surface of the dielectric material 109. The conductive features 126 and the antennas 121 may be formed using a same or similar formation method as the conductive features 117, thus details are not repeated. The conductive feature 126 may be a metal line (e.g., copper line) that electrically couples the via 125 with the antenna 121.

Figure 7A:
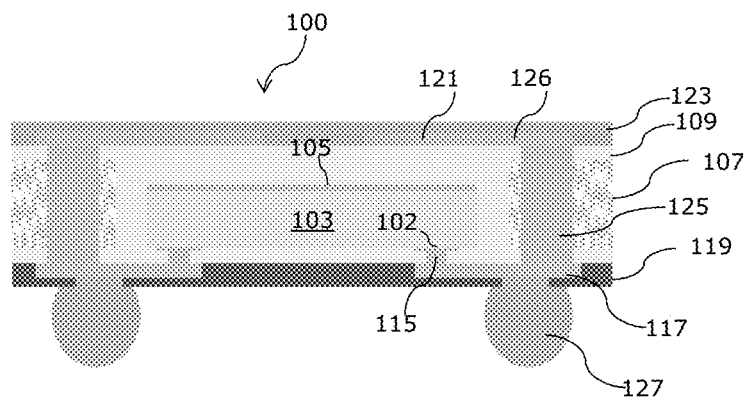
Figure 7B:
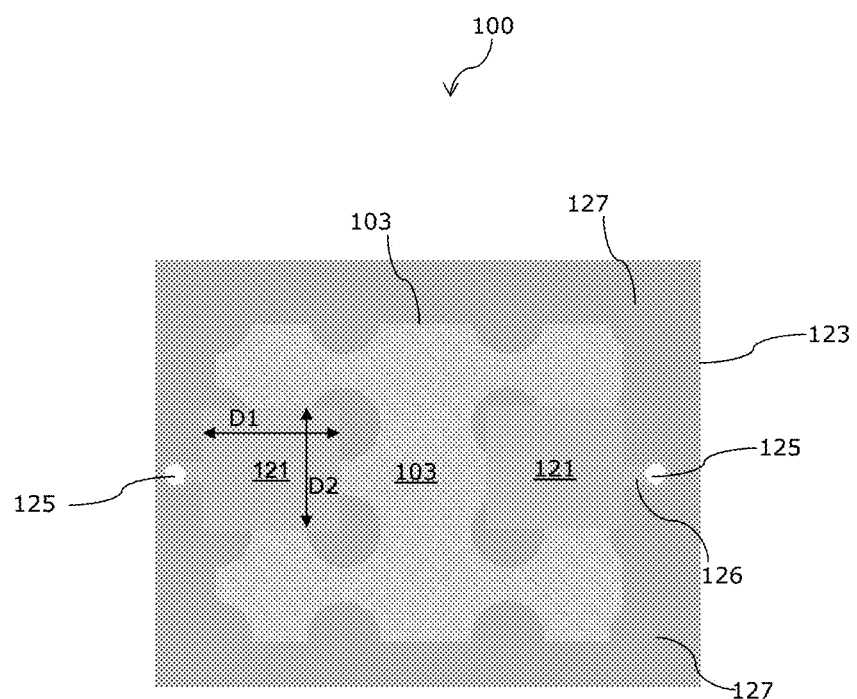

Referring temporarily to FIG. 7B, which shows the top views of the conductive feature 126 and the antenna 121. In the example of FIG. 7B, the antenna 121 is a rectangular shaped metal pattern (e.g., copper pattern) with a first dimension D1 and a second dimension D1, where D1 is between, e.g., 0.5 mm and 1.5 mm, and D2 is between, e.g., 0.5 mm and 1.5 mm. Depending on material parameters the dimensions of D1 and D2 can vary. In some embodiments, the dimensions of the antennas 121 are determined by the frequency of the radio signals being transmitted or received, thus may be modified to accommodate different RF communication frequencies. The antennas 121 are configured to transmit or receive RF signals. In the example of FIG. 7B, one of the antennas 121 may be a transmit (Tx) antenna, and the other one of the antennas 121 may be a receive (Rx) antenna. Therefore, the semiconductor device 100 may transmit and receive RF signals. In some embodiments, only one antenna (e.g., a Tx antenna or an Rx antenna) is formed, in which case the semiconductor device only transmits or only receives RF signals. In some embodiments, more than one Tx antennas or more than one Rx antennas are formed in the semiconductor device 100.

Referring back to FIG. 6, a dielectric layer 123 is formed over the upper surface of the dielectric material 109 and covers the antennas 121. The dielectric layer 123 may be formed of a same material as the dielectric layer 119 in some embodiment. In other embodiments, the dielectric layer 123 may be formed of a different dielectric material than the dielectric layer 119. In the illustrated embodiment, the dielectric layer 123 is a solder resist layer and is different from the dielectric layer 119.

Next, in FIG. 7A, external connectors 127 are formed. The external connectors 127 extend into the dielectric layer 119, and are mechanically and electrically coupled with the conductive features 117, in the illustrated embodiment. In an embodiment, the external connectors 127 are conductive bumps such as controlled collapse chip connection (C4) bumps and comprise a material such as tin, or other suitable materials, such as silver or copper. In an embodiment in which the external connectors 127 are tin solder bumps, the external connectors 127 may be formed by initially forming a layer of tin through any suitable method such as evaporation, electroplating, printing, solder transfer, ball placement, or the like. Once a layer of tin has been formed on the structure, a reflow is performed in order to shape the material into the bump shape.

However, while the external connectors 127 have been described above as C4 bumps, these are merely intended to be illustrative and are not intended to limit the embodiments. Rather, any suitable type of external contacts, such as ball grid arrays (BGAs), microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 127, and all such external connectors are fully intended to be included within the scope of the embodiments.

In some embodiments, the external connectors 127 are omitted. In embodiments where the external connectors 127 are omitted, openings may be formed in the dielectric layer 119 to exposes portions of the conductive features 117 for electrical connection with another device. For example, a land grid array (LGA) connector may be formed for the semiconductor device 100.

FIG. 7B shows a plan view of the semiconductor device 100 of FIG. 7A. Note that not all features of the semiconductor device 100 are illustrated in FIG. 7B, and features illustrated in FIG. 7B may not be along a same cross-section. FIG. 7B shows the perimeters (e.g., boundaries, or sidewalls) of the RFIC 103 and the dielectric layer 123. FIG. 7B also shows the vias 125, the antennas 121, and the conductive features 126 that electrically couple the vias 125 to the respective antennas 121. FIG. 7B further illustrates the external connectors 127.

During normal operation, RF signals generated by the RFIC 103 are routed from the conductive pads 102 to the antenna 121 through, e.g., the via 125 and the conductive features 117/126. The antenna 121 then transmits the RF signals at a specific RF band. Similarly, RF signals received at the antenna 121 are routed from the antenna 121 to the conductive pads 102, and the RFIC 103 processes the received RF signals.

Figure 8:
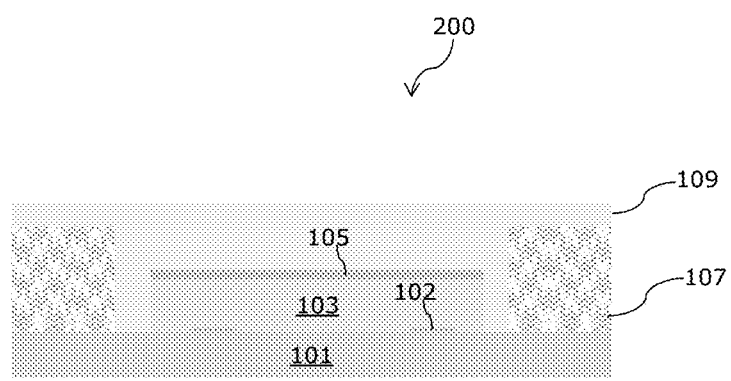
FIGS. 8-13 illustrate cross-sectionals views of a semiconductor device at various stages of fabrication, in an embodiment.

FIGS. 8-13 illustrate cross-sectional views of a semiconductor device 200 at various stages of fabrication, in an embodiment. In FIG. 8, the front side of an RFIC 103 is attached to a carrier 101. The RFIC 103 is positioned in an opening of a core 107, which is also attached to the carrier 101. A dielectric material 109 is formed around the RFIC 103 and fills the opening in the core 107. The semiconductor device 200 illustrated in FIG. 8 may be formed using a same or similar processing steps as illustrated in FIGS. 2 and 3. FIG. 8 further illustrates an optional ground plane 105 on the backside of the RFIC 103.

Figure 9:
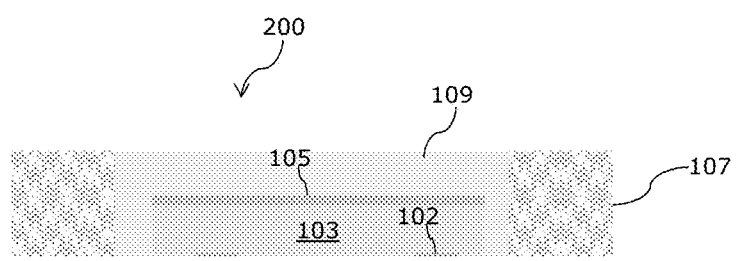

Next, in FIG. 9, an etching process, such as a dry plasma etching process or a chemical mechanical planarization (CMP) process, is performed to remove excess portions of the dielectric material 109 from the upper surface of the core 107. After the etching process, the upper surface of the dielectric material is level (e.g., coplanar) with the upper surface of the core 107. Next, the carrier 101 is removed, e.g., by a carrier de-bonding process. The lower surface of the dielectric material 109 is level (e.g., coplanar) with the lower surface of the core 107. The conductive pads 102 of the RFIC 103 are exposed at the lower surface of the dielectric material 109, as illustrated in FIG. 9.

Figure 10:
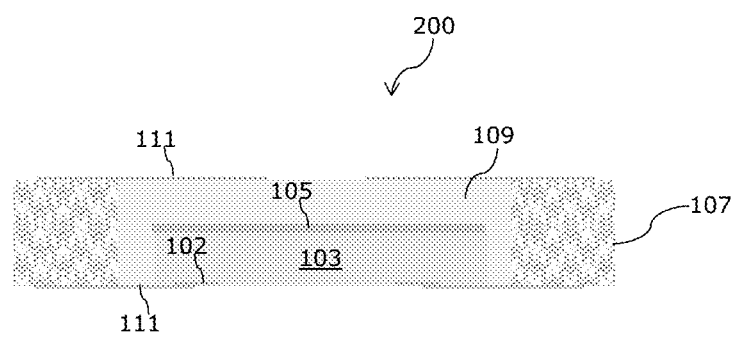

Next, in FIG. 10, seed layers 11 are formed over the upper and the lower surfaces of the dielectric material 109. The seed layers 11 may be, e.g., copper layers formed by, e.g., sputtering, PVD, CVD, or other suitable formation method. The seed layers 11 may be patterned, e.g., by forming a patterned mask layer over the seed layer 11 and etching exposed portions of the seed layers 11. In other embodiments, the seed layers 11 are blanket deposited and not patterned. As illustrated in FIG. 10, portions of the seed layers 11 overlap and physically contact the conductive pads 102 of the RFIC 103.

Figure 11:
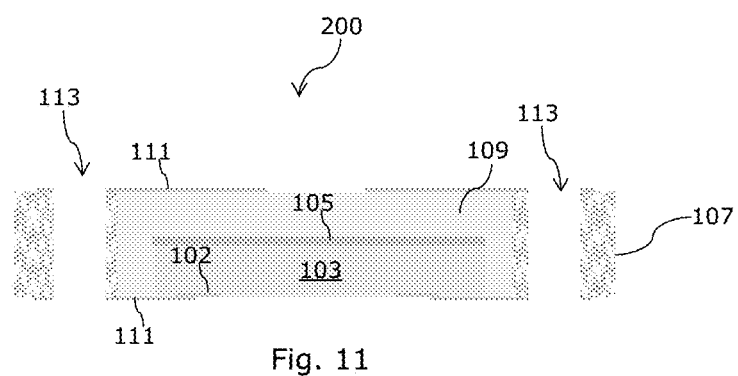

Next, in FIG. 11, openings 113 are formed in the core 107. The openings 113 may be formed by a mechanical drilling process. The openings 113 extend through the core 107 and may also extends through the seed layers 11.

Figure 12:
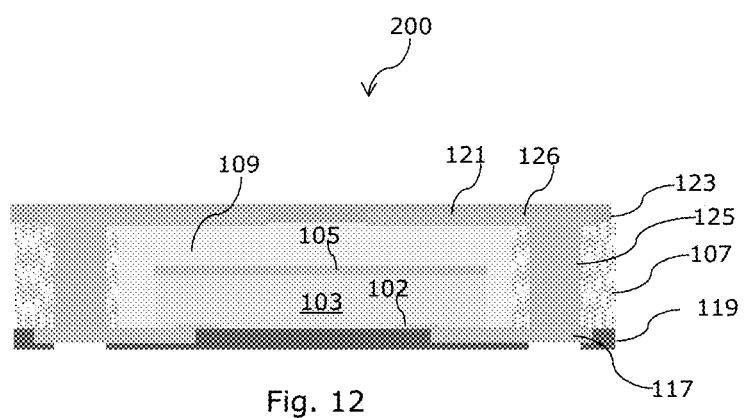

Next, in FIG. 12, an electrically conductive material (e.g., copper) is formed, e.g., by plating, in the openings 113 and over the seed layers 11. As a result, vias 125 are formed in the openings 113, and conductive features 117 are formed along the lower surface of the dielectric material 109 and/or along the lower surface of the core 107. In addition, conductive features 126 and antennas 121 are formed over the upper surface of the dielectric material 109 and/or over the upper surface of the core 107. In embodiments where the seed layers 11 are not patterned, a patterned mask layer is formed over the (un-patterned) seed layers 11 prior to the plating, and after the plating process is finished, the patterned mask layer is removed, and portions of the seed layers 111 over which no conductive material is plated are removed, e.g., by an etching process. Note that in FIG. 12, the conductive features 117, once formed, are electrically coupled to the conductive pads 102. Compared with the semiconductor device 100 (see, e.g., FIG. 6), no micro-vias 115 are needed to electrically couple the conductive features 117 with the conductive pads 102.

Still referring to FIG. 12, a dielectric layer 119 is formed on the lower surface of the dielectric material 109 and covers the conductive features 117. Openings may be formed in the dielectric layer 119 to expose portions of the conductive features 117. A dielectric layer 123, e.g., a solder resist layer, is formed over the upper surface of the dielectric material 109 and covers the antennas 121 and the conductive features 126.

Figure 13:
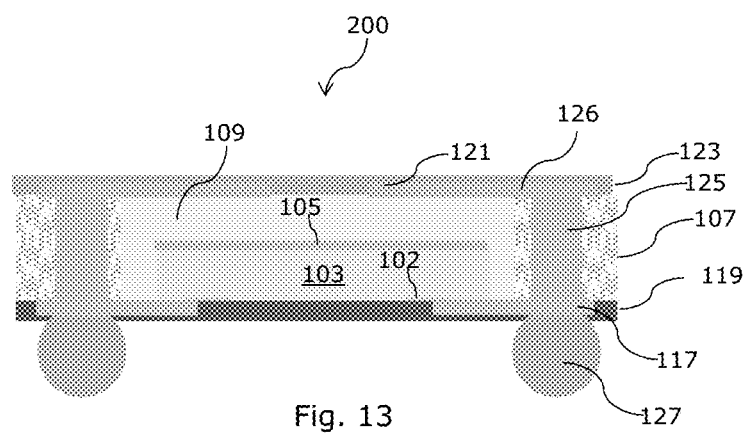

Next, in FIG. 13, external connectors 127, such as BGA, are formed. In other embodiments, the external connectors 127 are omitted, and a LGA connector may be formed for the semiconductor device 200.

The dielectric material 109 in the semiconductor device 200 of FIG. 13 has a same thickness as the core 107 according to an embodiment. In other words, the dielectric material 109 has a coplanar upper surface and a coplanar lower surface with the core 107. In contrast, the dielectric material 109 of the semiconductor device 100 in FIG. 7A has a larger thickness than the core 107, and as a result, the dielectric material 109 extends along and physically contacts the upper surface and the lower surface of the core 107.

FIGS. 14-19 illustrate cross-sectional views of a semiconductor device 300 at various stages of fabrication, in an embodiment. The formation process of the semiconductor device 300 is similar to that of the semiconductor device 200, but the vias 125 of the semiconductor device 300 are pre-formed as a part of the core 107.

Figure 14:
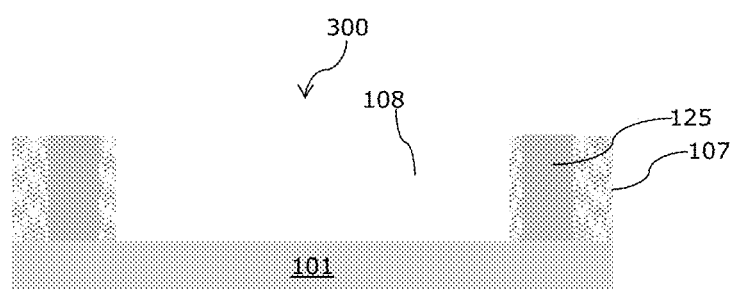
FIGS. 14-19 illustrate cross-sectional views of a semiconductor device at various stages of fabrication, in an embodiment.

In some embodiments, to form the pre-formed vias 125, conducive pillars (e.g., copper pillars) are formed over the carrier 101. Next, the material(s) of the core 107 (e.g., epoxy resin, or glass fiber) is formed over the carrier 101 and around the copper pillars to form the core 107. Once encapsulated by the core 107, the conductive pillars becomes (e.g., functions as) vias 125. An opening 108 is then formed (e.g., by drilling) in the core 107 to provide space for attaching the RFIC 103 in subsequent processing. FIG. 14 illustrates the core 107 with pre-formed vias 125 and an opening 108. Besides the above descried method, other methods for forming cores 107 with pre-formed vias 125 are possible, and are fully intended to be included within the scope of the present disclosure.

Figure 15:
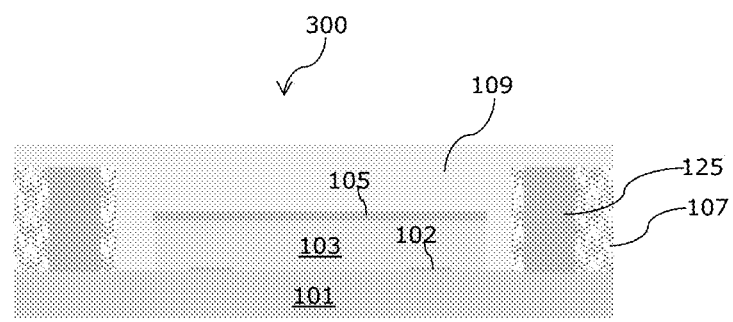

Next, in FIG. 15, the front side of an RFIC 103 is attached to the carrier 101, where the RFIC 103 in the opening of the core 107. Next, a dielectric material 109 is formed around the RFIC 103 and fills the opening. The dielectric material 109 may have excess portions disposed over the upper surface of the core 107.

Figure 16:
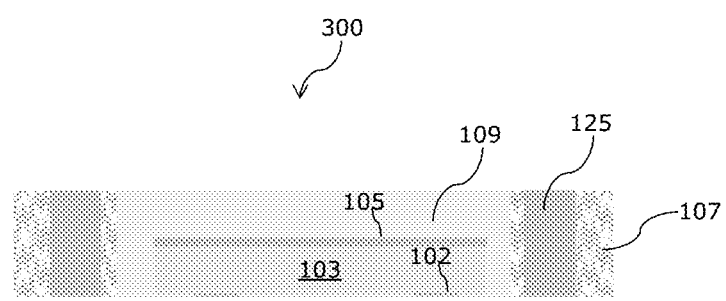

Next, in FIG. 16, an etching process, such as a dry plasma etching or a CMP process, is performed to remove the excess portions of the dielectric material 109, and thereafter, the carrier 101 is removed. After the etching process and the carrier de-bond, the vias 125 and the conductive pads 102 are exposed, as illustrated in FIG. 16.

Figure 17:
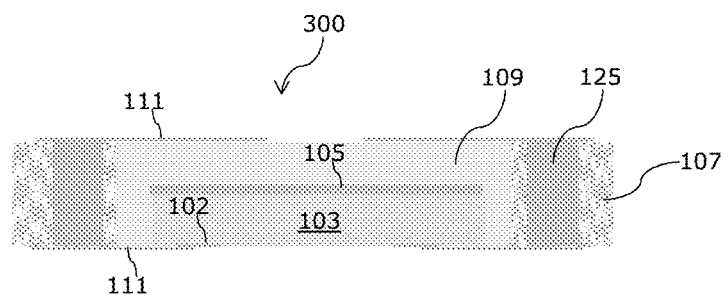

Next, in FIG. 17, seed layers 11 are formed over the upper and the lower surfaces of the dielectric material 109. As illustrated in FIG. 17, portions of the seed layers 11 overlap and physically contact the vias 125 and the conductive pads 102 of the RFIC 103.

Figure 18:
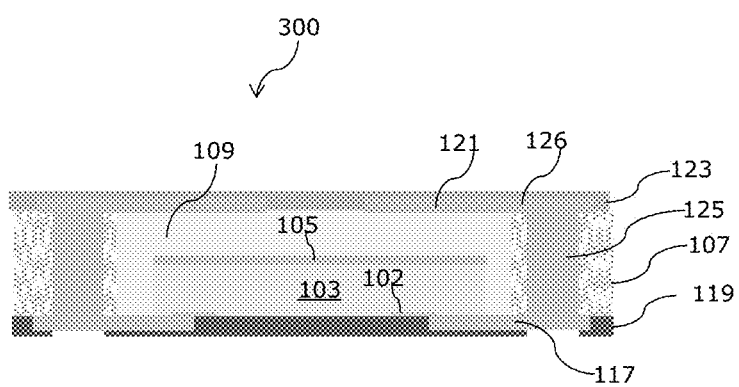

Next, in FIG. 18, an electrically conductive material (e.g., copper) is formed over the seed layer 111, e.g., by a plating process. Next, a dielectric layer 119 is formed over the lower surface of the dielectric material 109, and a dielectric layer 123 (e.g., a solder resist layer) is formed over the upper surface of the dielectric material 109.

Figure 19:
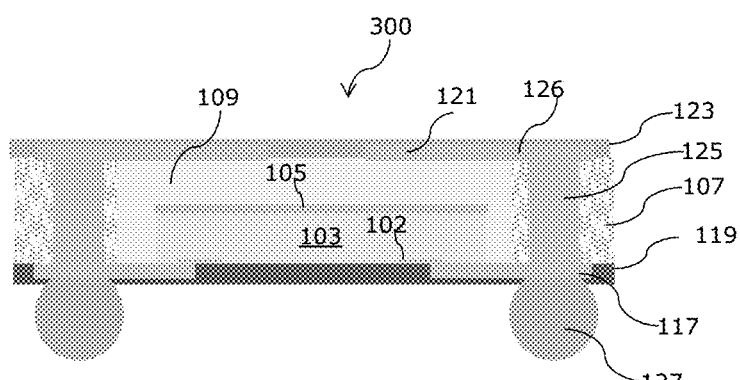

Next, in FIG. 19, external connectors 127, such as BGA, are formed to mechanically and electrically couple with the conductive features 117. In some embodiments, the external connectors 127 are omitted, and a LGA type of connector may be formed for the semiconductor device 300.

Variations to the disclosed embodiments are possible and are fully intended to be included within the scope of the present disclosure. For example, depending on the number of antennas 121 used and/or the target RF sensitivity of the semiconductor device formed, multiple metal layers and multiple dielectric layers may be formed over the upper surface of the dielectric material 109. FIGS. 20-24 illustrates cross-sectional views of various embodiment semiconductor devices.

Figure 20:
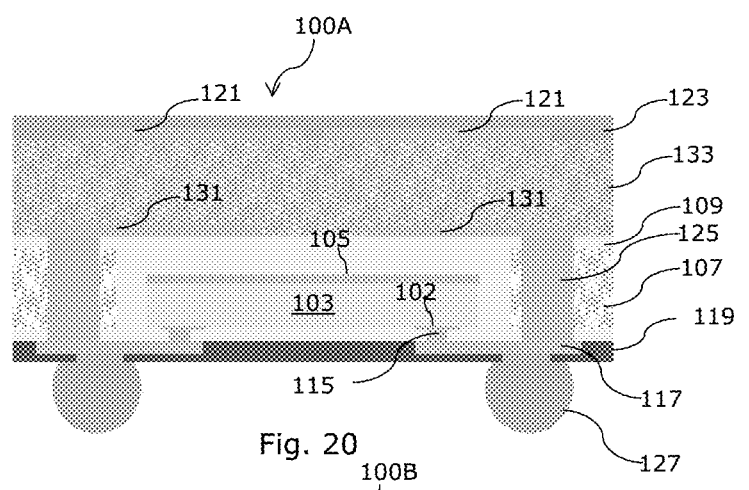
FIGS. 20-24 illustrates cross-sectional views of various embodiment semiconductor devices.

FIG. 20 illustrates the cross-sectional view of a semiconductor device 100A, in an embodiment. The semiconductor device 100A is similar to the semiconductor device 100 of FIG. 7A, but with an additional dielectric layer 133 between the dielectric material 109 and the dielectric layer 123. In FIG. 20, the via 125 electrically couples the RFIC 103 with conductive features 131 extending along (e.g., physically contacting) the upper surface of the dielectric material 109. The conductive features 131 may be, e.g., copper lines, and may have a same or similar shape as the conductive feature 126 in FIGS. 7A and 7B.

Still referring to FIG. 20, the dielectric layer 133 may be a high-performance RF material such as Rogers 3003. The antennas 121 are formed on the upper surface of the dielectric layer 133 and is covered by the dielectric layer 123 (e.g., a solder resist layer). Note that the antennas 121 are not electrically coupled to the conductive features 131 in FIG. 20. Instead, the antennas 121 (may also be referred to as patch antennas) are electromagnetically coupled to respective conductive features 131. The thickness and/or the material of the dielectric layer 133 may be adjusted to provide, e.g., different RF sensitivities of the semiconductor device 100A. The antenna structure shown in FIG. 20 may be referred to as a proximity coupled patch antenna.

Figure 21:
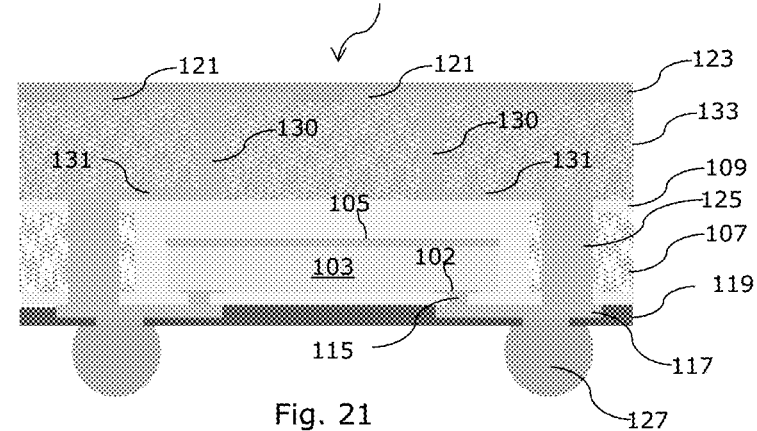

FIG. 21 illustrates the cross-sectional view of a semiconductor device 100B, in an embodiment. The semiconductor device 100B is similar to the semiconductor device 100A of FIG. 20, but with conductive feed lines 130 (e.g., copper lines or vias) directly connecting (e.g., electrically coupling) the antennas 121 with respective conductive features 131. The antenna structure shown in FIG. 21 may be referred to as a single layer probe feed antenna or a U-slot antenna.

Figure 22:
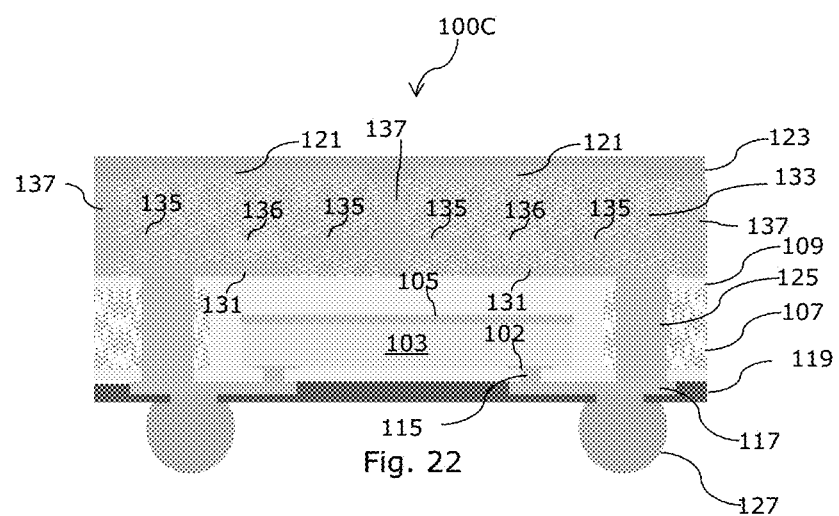

FIG. 22 illustrates the cross-sectional view of a semiconductor device 100C, in an embodiment. The semiconductor device 100C is similar to the semiconductor device 100A of FIG. 20, but has an additional grounding structure that comprises horizontal metal layers 135 (e.g., copper layers or copper lines) and vertical metal structures 137 (e.g., copper vias), where the horizontal metal layers 135 and the vertical metal structures 137 are electrically grounded. The vertical metal structures 137 may be formed of copper vias that extend from the upper surface of the dielectric layer 133 to the lower surface of the dielectric layer 133. The horizontal metal layers 135 and the vertical metal structures 137 may be referred to as grounded metal layers.

In FIG. 22, the horizontal metal layer 135 has openings 136 disposed between the antenna 121 and a respective conductive feature 131, such that RF signals emitted from the conductive feature 131 is electromagnetically coupled to the antenna 121 through the openings 136. In some embodiments, the grounding structure forms a Faraday cage around each pair of antenna 121 and conductive feature 131, such that EMI between different pairs of antenna 121 and conductive feature 131 is reduced. The Faraday cage may also help to reduce EMI from the RFIC 103 to other nearby devices and reduce EMI from other nearby devices to the RFIC 103. The antenna structure shown in FIG. 22 may be referred to as a dual layer aperture coupled antenna.

Figure 23:
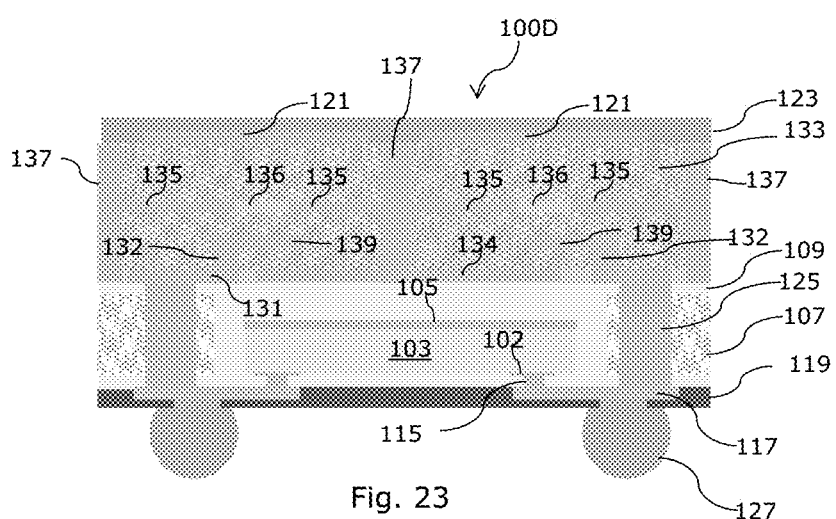

FIG. 23 illustrates the cross-sectional view of a semiconductor device 100D, in an embodiment. The semiconductor device 100D is similar to the semiconductor device 100C of FIG. 22, but with a via 132 coupled between the conductive feature 131 and another conductive feature 139 (e.g., a copper line). The conductive feature 139 is formed between the conductive feature 131 and the horizontal metal layer 135, thus is closer to the opening 136 in the horizontal metal layer 135. In addition, FIG. 23 shows a grounded metal layer 134 extending along and physically contacting the upper surface of the dielectric material 109. The grounded metal layer 134 is disposed directly over the RFIC 103 and between the conductive features 131. The semiconductor device 100D may achieve improved spurious mode suppression.

Figure 24:
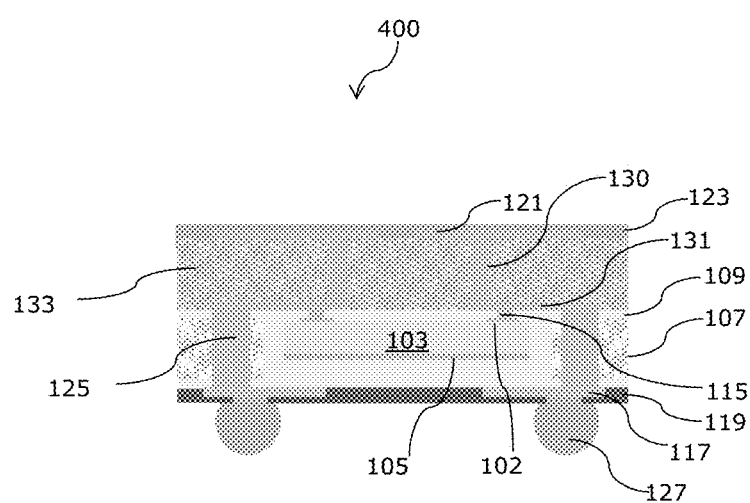

FIG. 24 illustrates the cross-sectional view of a semiconductor device 400, in an embodiment. The semiconductor device 400 is similar to the semiconductor device 100B of FIG. 21, but with the front side of the RFIC 103 facing the dielectric layer 133. In the example of FIG. 24, the conductive pads 102 of the RFIC 103 are electrically coupled to the conductive feature 131 by the micro-vias 115.

Additional variations are possible and are fully intended to be included within the scope of the present disclosure. For example, while the dielectric material 109 in FIGS. 20-24 has a larger thickness than that of the core 107, the embodiments in FIGS. 20-24 may be modified such that the dielectric material 109 has a same thickness as the core 107, similar to, e.g., the dielectric material 109 in the semiconductor device 200.

Embodiments may achieve advantages. For example, the disclosed embodiments provide improved integration density and reduce the size of the AiP devices formed. Smaller device size not only reduces the footprint of the AiP devices on the circuit board, but also improves the RF sensitivity due to reduced distance between the antennas 121 and the conductive features 131. The ground plane 105 on the backside of the RFIC 103 reduces EMI to or from the RFIC 103. The Faraday cages formed by the grounding structure further reduce EMI between different pairs of the antennas 121 and conductive features (e.g., 131 or 139) and may provide improved spurious mode suppression.

Figure 25:
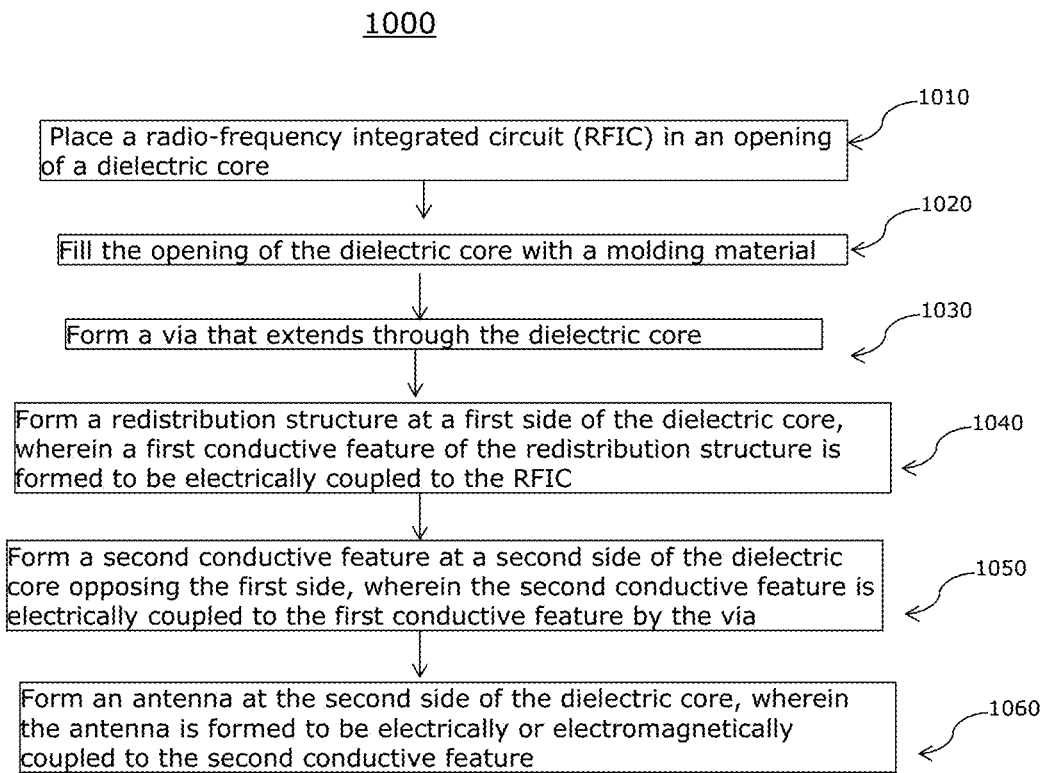
FIG. 25 is a flow chart of a method of forming a semiconductor device, in some embodiments.

FIG. 25 is a flow chart of a method of forming a semiconductor device, in some embodiments. It should be understood that the embodiment method shown in FIG. 25 is merely an example of many possible embodiment methods. One of ordinary skill in the art would recognize many variations, alternatives, and modifications. For example, various steps as illustrated in FIG. 25 may be added, removed, replaced, rearranged and repeated.

Referring to FIG. 25, at step 1010, a radio-frequency integrated circuit (RFIC) (e.g., 103) is placed in an opening of a dielectric core (see, e.g., 107 in FIG. 2). At step 1020, the opening of the dielectric core is filled with a dielectric material (see, e.g., 109 in FIG. 3). At step 1030, a via (see, e.g., 125 in FIG. 6) is formed that extends through the dielectric core. At step 1040, a redistribution structure (see, e.g., 118 in FIG. 6) is formed at a first side of the dielectric core, wherein a first conductive feature (see, e.g., 117) of the redistribution structure is formed to be electrically coupled to the RFIC. At step 1050, a second conductive feature (see, e.g., 126 in FIG. 6) is formed at a second side of the dielectric core opposing the first side, wherein the second conductive feature is electrically coupled to the first conductive feature by the via. At step 1060, an antenna (see, e.g., 121 in FIG. 6) is formed at the second side of the dielectric core, wherein the antenna is formed to be electrically or electromagnetically coupled to the second conductive feature.

Example embodiments of the present invention are summarized here. Other embodiments can also be understood from the entirety of the specification and the claims filed herein.

Example 1. In an embodiment, a semiconductor device includes: a dielectric core; a radio-frequency integrated circuit (RFIC) disposed in an opening of the dielectric core and surrounded by a dielectric material, where the dielectric material fills a space between the RFIC and the dielectric core; a redistribution structure at a first side of the dielectric material, where a first conductive feature of the redistribution structure is electrically coupled to the RFIC; an antenna at a second side of the dielectric material opposing the first side; and a via laterally spaced apart from the RFIC and extending through the dielectric core, where a first end of the via is electrically coupled to the first conductive feature of the redistribution structure, and a second end of the via is electrically coupled to the antenna or is electrically coupled to a second conductive feature extending along the second side of the dielectric material, and where the second conductive feature is configured to be electromagnetically coupled to the antenna.

Example 2: The semiconductor device of Example 1, wherein the redistribution structure comprises a dielectric layer and the first conductive feature in the dielectric layer.

Example 3. The semiconductor device of Example 1, further comprising an external connector electrically coupled to the first conductive feature of the redistribution structure, wherein the redistribution structure is between the external connector and the RFIC.

Example 4. The semiconductor device of Example 1, further comprising a solder resist layer at the second side of the dielectric material, wherein the solder resist layer covers the antenna.

Example 5. The semiconductor device of Example 1, wherein the dielectric material and the dielectric core have a coplanar upper surface and a coplanar lower surface.

Example 6. The semiconductor device of Example 1, wherein the dielectric material has a first thickness that is larger than a second thickness of the dielectric core, wherein the first thickness and the second thickness are measured along a direction from the first side of the dielectric material to the second side of the dielectric material.

Example 7. The semiconductor device of Example 1, wherein the antenna extends along and contacts the second side of the dielectric material, wherein the second end of the via is electrically coupled to the antenna.

Example 8. The semiconductor device of Example 1, further comprising a dielectric material between the dielectric material and the antenna, wherein the antenna extends along and contacts a first side of the dielectric material facing away from the RFIC, wherein the second end of the via is electrically coupled to the second conductive feature that extends parallel to the second side of the dielectric material.

Example 9. The semiconductor device of Example 8, further comprising a conductive feed line in the dielectric material that electrically couples the second conductive feature to the antenna.

Example 10. The semiconductor device of Example 8, further comprising a metal layer in the dielectric material, the metal layer disposed between antenna and the second conductive feature, wherein the metal layer extends parallel to the second side of the dielectric material, is electrically grounded, and has an opening, wherein the second conductive feature is configured to be electromagnetically coupled to the antenna through the opening of the metal layer.

Example 11. The semiconductor device of Example 10, further comprising metal structures in the dielectric material and on opposing sides of the opening of the metal layer, wherein the metal structures are electrically grounded and extend from the first side of the dielectric material to a second side of the dielectric material facing the RFIC.

Example 12: In an embodiment, a semiconductor device includes: a dielectric substrate; an integrated circuit (IC) die disposed inside an opening of the dielectric substrate, where the IC die is configured to transmit or receive radio frequency (RF) signals; a dielectric material in the opening of the dielectric substrate and around the IC die; a redistribution structure along a first side of the dielectric substrate, where a first conductive feature of the redistribution structure is electrically coupled to the IC die; a second conductive feature along a second side of the dielectric substrate opposing the first side; a via extending through the dielectric substrate, where the via electrically couples the first conductive feature and the second conductive feature; and an antenna at the second side of the dielectric substrate, where the second conductive feature is electrically or electromagnetically coupled to the antenna.

Example 13. The semiconductor device of Example 12, wherein the antenna and the second conductive feature are at a same distance from the IC die.

Example 14. The semiconductor device of Example 12, further comprising a dielectric material between the antenna and the second conductive feature, wherein the antenna extends further from the IC die than the second conductive feature.

Example 15. The semiconductor device of Example 14, further including a grounded metal layer in the dielectric material, wherein the grounded metal layer has an opening and is between the antenna and the second conductive feature.

Example 16. The semiconductor device of Example 12, wherein the IC die has input/output (I/O) pads at a front side of the IC die and has a ground plane on a backside of the IC die.

Example 17. The semiconductor device of Example 16, wherein the front side of the IC die faces the antenna.

Example 18. In an embodiment, a method includes: placing a radio-frequency integrated circuit (RFIC) in an opening of a dielectric core; filling the opening of the dielectric core with a dielectric material; forming a via that extends through the dielectric core; forming a redistribution structure at a first side of the dielectric core, where a first conductive feature of the redistribution structure is formed to be electrically coupled to the RFIC; forming a second conductive feature at a second side of the dielectric core opposing the first side, where the second conductive feature is electrically coupled to the first conductive feature by the via; and forming an antenna at the second side of the dielectric core, where the antenna is formed to be electrically or electromagnetically coupled to the second conductive feature.

Example 19. The method of Example 18, further comprising forming a dielectric material between the second conductive feature and the antenna.

Example 20. The method of Example 19, further comprising forming, in the dielectric material, a grounded metal layer having an opening, wherein the grounded metal layer is formed between the second conductive feature and the antenna.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a dielectric core;
   a radio-frequency integrated circuit (RFIC) disposed in an opening of the dielectric core and surrounded by a first dielectric material, wherein the first dielectric material has a homogenous composition and fills a space between the RFIC and the dielectric core;
   a redistribution structure at a first side of the first dielectric material, wherein a first conductive feature of the redistribution structure is electrically coupled to the RFIC;
   a second conductive feature directly contacting and extending along a second side of the first dielectric material opposing the first side;
   a dielectric layer at the second side of the first dielectric material, wherein the dielectric layer comprises a second dielectric material that extends continuously from a first surface of the dielectric layer facing the RFIC to a second surface of the dielectric layer distal from the RFIC, wherein the first surface of the dielectric layer directly contacts and extends along the second side of the first dielectric material;
   an antenna directly contacting and extending along the second surface of the dielectric layer, wherein the antenna is a single-layer metal pattern; and
   a via laterally spaced apart from the RFIC and extending through the dielectric core, wherein a first end of the via is electrically coupled to the first conductive feature of the redistribution structure, and a second end of the via is electrically coupled to the second conductive feature, and wherein the second conductive feature is configured to be electrically or electromagnetically coupled to the antenna.

2. The semiconductor device of claim 1, wherein the redistribution structure comprises a layer of a third dielectric material and the first conductive feature in the layer of the third dielectric material.

3. The semiconductor device of claim 1, further comprising an external connector electrically coupled to the first conductive feature of the redistribution structure, wherein the redistribution structure is between the external connector and the RFIC.

4. The semiconductor device of claim 1, further comprising a solder resist layer at the second surface of the dielectric layer, wherein the solder resist layer contacts and extends along the antenna and the second surface of the dielectric layer.

5. The semiconductor device of claim 1, wherein the first dielectric material has a first thickness that is larger than a second thickness of the dielectric core, wherein the first thickness and the second thickness are measured along a direction from the first side of the first dielectric material to the second side of the first dielectric material.

6. The semiconductor device of claim 1, further comprising a conductive feed line in the dielectric layer that electrically couples the second conductive feature to the antenna.

7. The semiconductor device of claim 1, further comprising a metal layer in the dielectric layer, the metal layer disposed between the antenna and the second conductive feature, wherein the metal layer extends parallel to the second side of the first dielectric material, is electrically grounded, and has an opening, wherein the second conductive feature is configured to be electromagnetically coupled to the antenna through the opening of the metal layer.

8. The semiconductor device of claim 7, further comprising metal structures in the dielectric layer and on opposing sides of the opening of the metal layer, wherein the metal structures are electrically grounded and extend continuously from the first surface of the dielectric layer to the second surface of the dielectric layer.

9. The semiconductor device of claim 8, wherein the metal structures extend perpendicular to the metal layer and intersect the metal layer.

10. The semiconductor device of claim 1, wherein the RFIC has input/output (I/O) pads at a front side of the RFIC and has a ground plane on a backside of the RFIC.

11. A semiconductor device comprising:
    a dielectric substrate;
    an integrated circuit (IC) die disposed inside an opening of the dielectric substrate, wherein the IC die is configured to transmit or receive radio frequency (RF) signals;
    a first dielectric material in the opening of the dielectric substrate and around the IC die, wherein the first dielectric material is a single-material layer;
    a redistribution structure along a first side of the first dielectric material, wherein a first conductive feature of the redistribution structure is electrically coupled to the IC die;
    a second conductive feature along and directly contacting a second side of the first dielectric material opposing the first side;
    a dielectric layer having a first surface directly contacting and extending along the second side of the first dielectric material, and having a second surface distal from the first dielectric material, wherein the dielectric layer comprises a second dielectric material that extends continuously from the first surface of the dielectric layer to the second surface of the dielectric layer;
    a via extending through the dielectric substrate, wherein the via electrically couples the first conductive feature and the second conductive feature;
    an antenna directly contacting and extending along the second surface of the dielectric layer, wherein the second conductive feature is configured to be electrically or electromagnetically coupled to the antenna; and
    a grounded metal layer in the dielectric layer, wherein the grounded metal layer has an opening and is between the antenna and the second conductive feature.

12. The semiconductor device of claim 11, wherein the IC die has input/output (I/O) pads at a front side of the IC die and has a ground plane on a backside of the IC die.

13. The semiconductor device of claim 12, wherein the front side of the IC die faces the antenna.

14. The semiconductor device of claim 11, wherein the antenna is a single-layer metal pattern.

15. The semiconductor device of claim 14, further comprising vias in the dielectric layer, wherein the vias are grounded and extend continuously from the first surface of the dielectric layer to the second surface of the dielectric layer, wherein the vias intersect the grounded metal layer in the dielectric layer.

16. The semiconductor device of claim 15, wherein a sidewall of a first via of the vias in the dielectric layer is vertically aligned with a sidewall of the dielectric substrate along a same line.

17. A semiconductor device comprising:
- a radio-frequency integrated circuit (RFIC) in an opening of a dielectric core;
- a first dielectric material in the opening of the dielectric core around the RFIC, wherein the first dielectric material directly contacts and extends along a first side of the dielectric core and an opposing second side of the dielectric core, wherein the first dielectric material has a homogenous composition;
- a via extending through the dielectric core;
- a redistribution structure at the first side of the dielectric core, wherein a first conductive feature of the redistribution structure is electrically coupled to the RFIC;
- a second conductive feature at the second side of the dielectric core, wherein the second conductive feature directly contacts and extends along a first side of the first dielectric material distal from the RFIC, and is electrically coupled to the first conductive feature by the via;
- a dielectric layer at the second side of the dielectric core, wherein a first surface of the dielectric layer directly contacts the first side of the first dielectric material, wherein a second dielectric material of the dielectric layer extends continuously from the first surface of the dielectric layer to a second surface of the dielectric layer opposing the first surface; and
- an antenna at the second side of the dielectric core, wherein the antenna directly contacts and extends along the second surface of the dielectric layer, and is configured to be electrically or electromagnetically coupled to the second conductive feature.

18. The semiconductor device of claim 17, further comprising a grounded metal layer in the dielectric layer between the second conductive feature and the antenna, wherein the grounded metal layer has an opening.

19. The semiconductor device of claim 18, further comprising grounded vias in the dielectric layer, wherein the grounded vias extend from the first surface of the dielectric layer to the second surface of the dielectric layer, wherein the grounded vias extend through and contact the grounded metal layer.

20. The semiconductor device of claim 17, wherein the antenna is a single-layer metal pattern.

* * * * *